(12) United States Patent
Anderson et al.

(10) Patent No.: US 8,384,690 B2
(45) Date of Patent: Feb. 26, 2013

(54) INTERFACE DEVICE WITH INTEGRATED SOLAR CELL(S) FOR POWER COLLECTION

(75) Inventors: Brent A. Anderson, Jericho, VT (US); Mark D. Jaffe, Shelburne, VT (US); Jed H. Rankin, South Burlington, VT (US)

(73) Assignee: International Business Machines Corp., Armonk, NY (US)

( * ) Notice: Subject to any disclaimer, the term of this patent is extended or adjusted under 35 U.S.C. 154(b) by 273 days.

(21) Appl. No.: 12/779,994

(22) Filed: May 14, 2010

(65) Prior Publication Data

US 2011/0279399 A1 Nov. 17, 2011

(51) Int. Cl.
G06F 3/041 (2006.01)
G06F 3/045 (2006.01)
H01L 31/042 (2006.01)

(52) U.S. Cl. .......................... 345/174; 345/173; 136/244

(58) Field of Classification Search .................. 345/173, 345/174, 175
See application file for complete search history.

(56) References Cited

U.S. PATENT DOCUMENTS

| | | | |
|---|---|---|---|
| 5,453,134 A | 9/1995 | Arai et al. | |
| 5,523,776 A | 6/1996 | Hougham et al. | |
| 5,990,995 A | 11/1999 | Ebihara et al. | |
| 6,274,861 B1* | 8/2001 | Zhang et al. | 250/208.1 |
| 6,739,505 B2 | 5/2004 | Walker et al. | |
| 6,788,295 B1 | 9/2004 | Inkster | |
| 7,042,548 B2 | 5/2006 | Zhang et al. | |
| 7,388,147 B2 | 6/2008 | Mulligan et al. | |
| 2005/0117096 A1 | 6/2005 | Voloschenko et al. | |
| 2005/0182927 A1 | 8/2005 | Shatford | |
| 2005/0183764 A1 | 8/2005 | Han et al. | |
| 2006/0202925 A1* | 9/2006 | Manning et al. | 345/87 |
| 2008/0094025 A1 | 4/2008 | Rosenblatt et al. | |
| 2008/0284925 A1* | 11/2008 | Han | 349/12 |
| 2008/0309627 A1* | 12/2008 | Hotelling et al. | 345/173 |
| 2009/0002336 A1* | 1/2009 | Choi et al. | 345/174 |
| 2009/0009847 A1 | 1/2009 | Sasagawa et al. | |
| 2009/0141004 A1* | 6/2009 | Yamazaki | 345/175 |
| 2009/0174928 A1 | 7/2009 | Kim et al. | |
| 2009/0179611 A1 | 7/2009 | Sander et al. | |
| 2009/0219273 A1 | 9/2009 | Nathan et al. | |
| 2010/0078230 A1* | 4/2010 | Rosenblatt et al. | 178/18.01 |

* cited by examiner

*Primary Examiner* — Joseph Haley
*Assistant Examiner* — Nicholas Lee
(74) *Attorney, Agent, or Firm* — Gibb & Riley, LLC; Michael J. Lestrange, Esq.

(57) ABSTRACT

Disclosed herein are embodiments of an interface device (e.g., a display, touchpad, touchscreen display, etc.) with integrated power collection functions. In one embodiment, a solar cell or solar cell array can be located within a substrate at a first surface and an array of interface elements can also be located within the substrate at the first surface such that portions of the solar cell(s) laterally surround the individual interface elements or groups thereof. In another embodiment, a solar cell or solar cell array can be located within the substrate at a first surface and an array of interface elements can be located within the substrate at a second surface opposite the first surface (i.e., opposite the solar cell or solar cell array). In yet another embodiment, an array of diodes, which can function as either solar cells or sensing elements, can be within a substrate at a first surface and can be wired to allow for selective operation in either a power collection mode or sensing mode.

20 Claims, 8 Drawing Sheets

Array 310 Of Solar Cells 311 And Corresponding Array 320 Of Interface Elements With One Type Of Interface Element 321 Or 322 Within Each Solar Cell 311

INTERFACE DEVICE WITH INTEGRATED SOLAR CELL(S) FOR POWER COLLECTION

BACKGROUND

1. Field of the Invention

The embodiments of the invention generally relate to interface devices, such as displays, touchpads or touchscreen displays, and, more specifically, to an interface device having integrated solar cell(s) for power collection.

2. Description of the Related Art

Interface devices (e.g., displays, touchpads, touchscreens, etc.) for consumer electronics are often made up of an array of interface elements (e.g., display elements or pixels, touch sensing elements, etc.) formed within a substrate and covered by glass or some other transparent material. In many consumer electronics these interface devices have relatively large surface areas that are exposed to light. Thus, recently, consumer electronics have been developed in which interface devices are stacked above solar cell(s), thereby taking advantage of the light exposure for solar power collection.

SUMMARY

Disclosed herein are embodiments of an interface device (e.g., a display, touchpad, touchscreen display, etc.) with integrated power collection functions. In one embodiment, a solar cell or solar cell array can be located within a substrate at a first surface and an array of interface elements can also be located within the substrate at the first surface such that portions of the solar cell(s) laterally surround the individual interface elements or groups thereof. In another embodiment, a solar cell or solar cell array can be located within the substrate at a first surface and an array of interface elements can be located within the substrate at a second surface opposite the first surface (i.e., opposite the solar cell or solar cell array). In yet another embodiment, an array of diodes, which can function as either solar cells or sensing elements, can be within a substrate at a first surface and can be wired to allow for selective operation in either a power collection mode or sensing mode.

More particularly, in one embodiment, the interface device can comprise a substrate with a first surface and a second surface opposite the first surface. A solar cell can be positioned within the substrate at the first surface. Additionally, an array of interface elements can be positioned within the substrate also at the first surface such that portions of the solar cell laterally surround either each one of the interface elements individually or groups of the interface elements.

In another embodiment, the interface device can comprise a substrate with a first surface and a second surface opposite the first surface. An array of solar cells can be positioned within the substrate at the first surface. A corresponding array of interface elements can also be positioned within the substrate at the first surface such that each solar cell has portions that laterally surround either a corresponding one of the interface elements or a corresponding group of the interface elements.

In each of the above-described embodiments, the interface device comprises solar cell(s) and interface elements that are positioned within a substrate at the same surface. In yet another embodiment, the interface device can similarly comprise a substrate with a first surface and a second surface opposite the first surface. A solar cell or an array of solar cells (i.e., at least one solar cell) can be positioned within the substrate at the first surface. However, in this embodiment, an array of interface elements can be positioned within the substrate at the second surface (i.e., opposite the solar cell(s)), rather than at the first surface.

In each of the above-described interface embodiments, the interface device incorporates separate devices for power collection and interface functions (i.e., solar cell(s) and interface elements, respectively). In yet another embodiment, the interface device can similarly comprise a substrate having a first surface and a second surface opposite the first surface. An array of diodes that can function as either solar cells or interface elements (e.g., touch sensing elements) can be positioned within the substrate at the first surface. Additionally, a wiring structure can be connected to the diodes and can be configured to allow the array of diodes to be selectively operated in either a power collection mode (during which all of the diodes in the array are electrically joined and function as solar cells) or a sensing mode (during which all of the diodes in the array are electrically disjoined, individually selectable and function as sensing elements).

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1A:
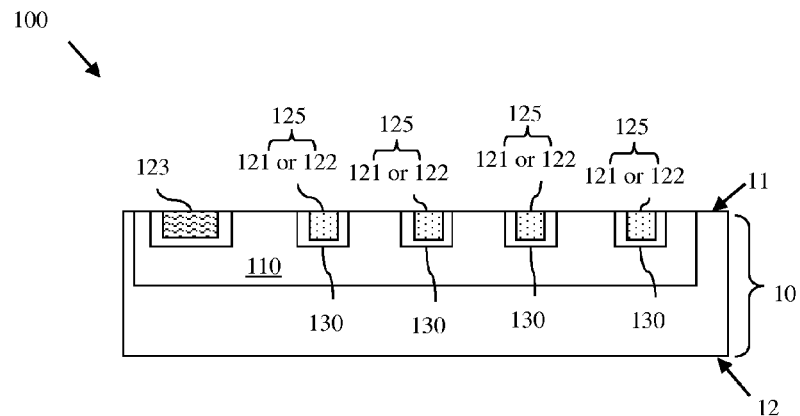
FIG. 1A is a cross-section diagram illustrating an embodiment of an interface device with integrated power collection functions.

The embodiments of the invention and the various features and advantageous details thereof are explained more fully with reference to the non-limiting embodiments that are illustrated in the accompanying drawings and detailed in the following description.

As mentioned above, interface devices (e.g., displays, touchpads, touchscreens, etc.) for consumer electronics are typically made up of an array of interface elements (e.g., display elements, touch sensing elements, etc.) formed within or on a substrate and covered by glass or some other transparent material. In many consumer electronics these interface devices have relatively large surface areas that are exposed to light. Thus, recently, consumer electronics have been developed in which interface devices are stacked above solar cell(s), thereby taking advantage of the light exposure for solar power collection. Unfortunately, stacking of devices in this manner can be costly in terms of processing (i.e., the time and overhead associated with separately manufacturing the solar cell(s) and display elements) and in terms of space (i.e., the additional area required within the consumer electronic product for the solar cell(s).

In view of the foregoing disclosed herein are embodiments of an interface device (e.g., a display, touchpad, touchscreen display, etc.) with integrated power collection functions. In one embodiment, a solar cell or solar cell array can be located within a substrate at a first surface and an array of interface elements can also be located within the substrate at the first surface such that portions of the solar cell(s) laterally surround the individual interface elements or groups thereof. In another embodiment, a solar cell or solar cell array can be located within the substrate at a first surface and an array of interface elements can be located within the substrate at a second surface opposite the first surface (i.e., opposite the solar cell or solar cell array). In yet another embodiment, an array of diodes, which can function as either solar cells or sensing elements, can be within a substrate at a first surface and can be wired to allow for selective operation in either a power collection mode or sensing mode.

More particularly, FIGS. 1A-B, 2A-B, 3A-B, 4A-B, 5A-C, and 6A-B show various different embodiments of an interface device 100, 200, 300, 400, 500, and 600, respectively, having integrated power collection functions. Each these interface devices 100, 200, 300, 400, 500, and 600 can be incorporated into a portable electronic product (e.g., a personal digital assistant, smart phone, portable media player, netbook or notebook computer, etc.) or any other type of electronic product (e.g., an electronic billboard) for which integrated power collection without significant penalties in terms of product size would be advantageous.

Referring to FIGS. 1A-B and 2A-B, in one embodiment, the interface device 100, 200 can comprise a substrate 10 (e.g., a Group IV semiconductor substrate, such as silicon or germanium) with a first surface 11 and a second surface 12 opposite the first surface 10.

The interface device 100, 200 can further comprise a solar cell 110, 210 (i.e., a photovoltaic cell) positioned within the substrate 10 at the first surface 11. This solar cell 110, 210 can comprise any suitable solar cell configuration. For example, the solar cell 110, 210 can comprise a defined, large-area, planar, P-N junction diode type solar cell within and at the first surface 11 of the substrate 10. Alternatively, the solar cell 110, 210 can comprise a thin film type solar cell, including, for example, a power conductor layer within the substrate 10, a p-type silicon layer on the power conductor layer, an n-type silicon layer on the p-type silicon layer, a ground conductor grid layer on the n-type silicon layer and an anti-reflective coating layer on the conductor grid layer. Such solar cell configurations are well-known in the art and, thus, the details are omitted from this specification in order to allow the reader to focus on the salient aspects of the embodiments described.

Figure 1B:
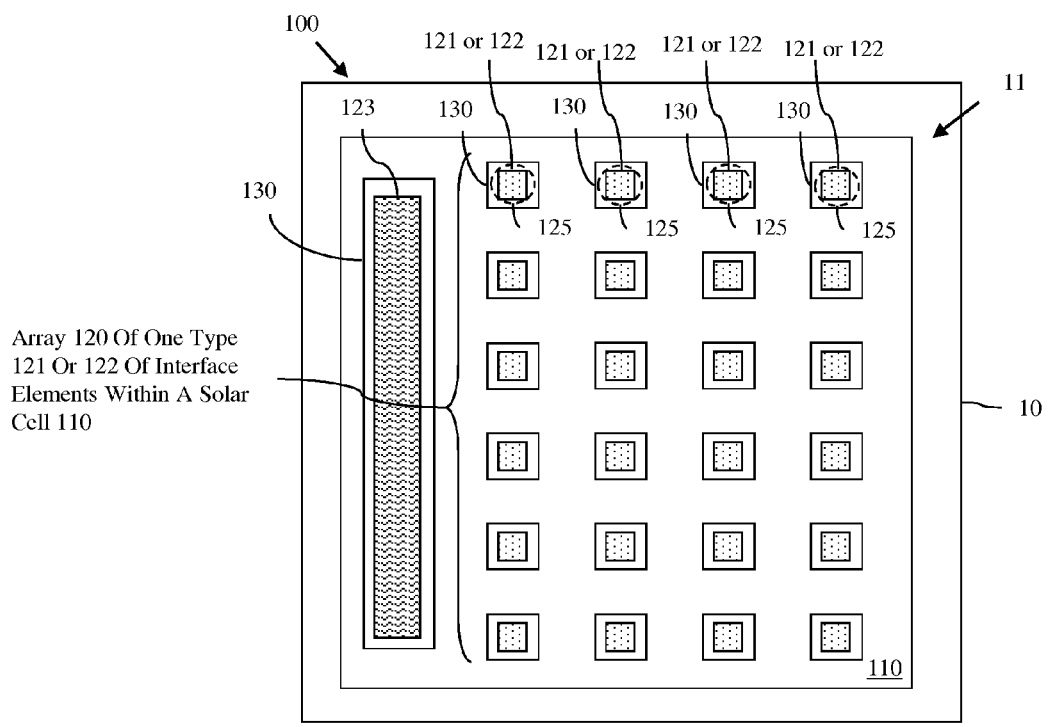
FIG. 1B is a top view diagram further illustrating the embodiment of the interface device of FIG. 1A.
Figure 2A:
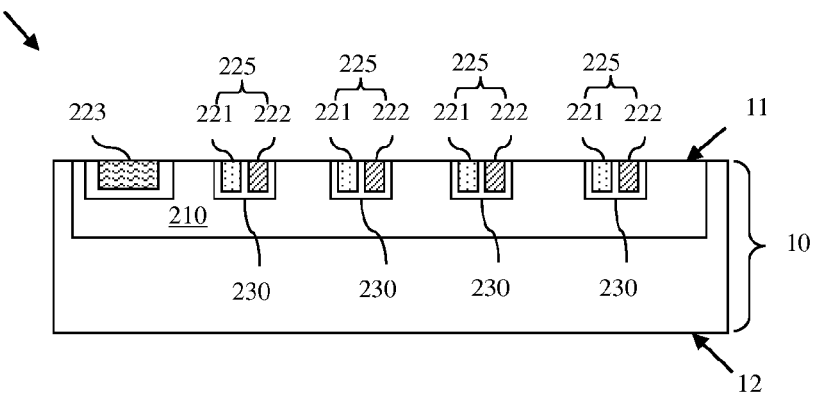
FIG. 2A is a cross-section diagram illustrating another embodiment of an interface device with integrated power collection functions.
Figure 2B:
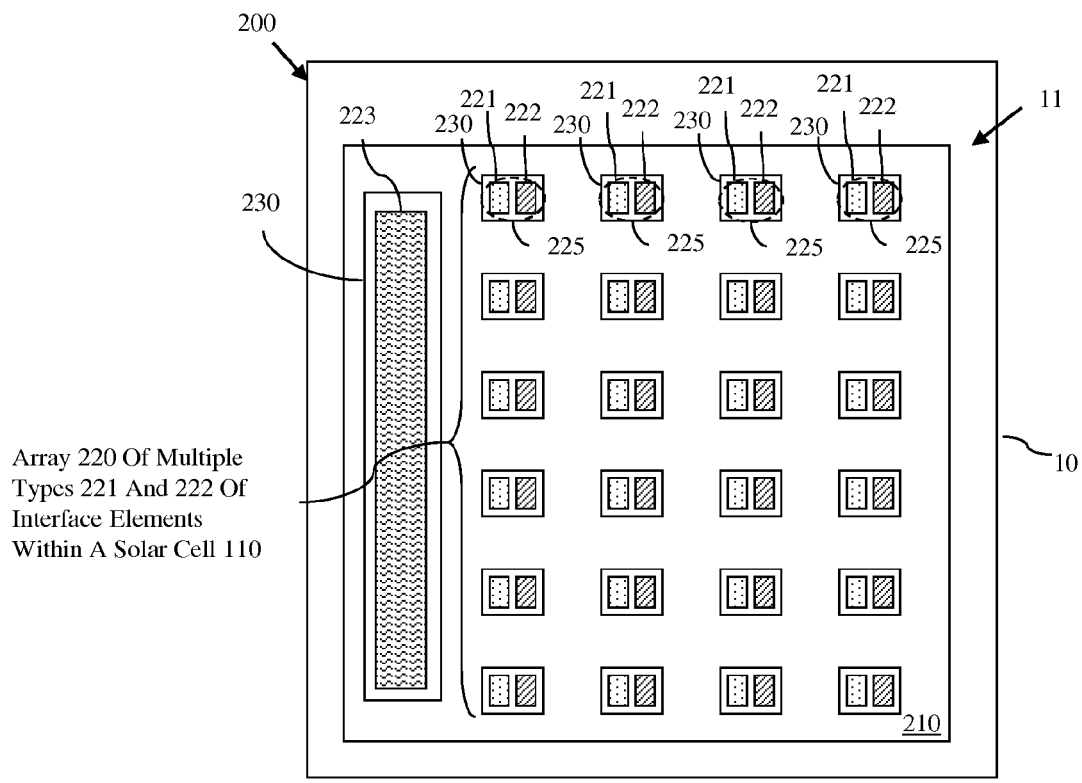
FIG. 2B is a top view diagram further illustrating the embodiment of the interface device of FIG. 2A.

The interface device 100, 200 can also comprise an array 120, 220 of interface elements within the substrate 10 also at the first surface 11. As illustrated in FIGS. 1A-B, the interface elements of interface device 100 can all be of the same type (e.g., all interface elements 121 or all interface elements 122) or can be of multiple different types (e.g., a distributed mixture of both interface elements 121 and 122) and each interface element 121 or 122 can constitute a pixel 125. The pixels 125 can, for example, be arranged in a grid pattern (i.e., a pattern of columns and rows) such that portions of the solar cell 110 laterally surround each pixel 125 (i.e., each interface element 121 or 122 individually) and are further positioned between any adjacent pixels (i.e., between any adjacent interface elements). The interface elements in the array 120 can, for example, comprise display elements 121 for a display screen that can be used by the electronic product to display information (e.g., text, images, etc.) to a user, touch sensing elements 122 for a touchpad (e.g., an electrical or optical touchpad) that can be used by the electronic product to receive input information from a user or a combination of both display and touch sensing elements 121, 122 for a touchscreen display that can be used by the electronic product to both display information and receive input. Alternatively, as illustrated in FIGS. 2A-B, the interface elements of interface device 200 can be of multiple different types (e.g., interface elements 221 and 222) and a group of interface elements, including one of each of the different types 221, 222, can constitute a pixel 225. The pixels 225 can, for example, be arranged in a grid pattern (i.e., a pattern of columns and rows) such that portions of the solar cell 210 laterally surround each pixel 225 (i.e., each group of interface elements) and are further positioned between any adjacent pixels (i.e., between any adjacent groups of interface elements). The interface elements in the array 220 can comprise, for example, both display elements 221 and touch sensing elements 222 for a touchscreen display that can be used by the electronic product to display information (e.g., text, images, etc.) to a user and also receive input information from a user.

Display elements 121, 221 can comprise, for example, conventional light emitting diodes (LEDs), organic light emitting diodes (OLEDs), liquid crystal display elements (LCDs) or any other suitable display element that can be formed within a semiconductor substrate. Such display elements 121, 221 (e.g., LEDs, OLEDs, LCDs, etc.) are well-known in the art and, thus, the details are omitted from this specification in order to allow the reader to focus on the salient aspects of the embodiments described.

Touch sensing elements 122, 222 can comprise, for example, electrical touch sensing elements (e.g., capacitive touch sensing elements, resistive touch sensing elements, inductive touch sensing elements or any other touch sensing elements that can be formed within a semiconductor substrate). Electrical touch sensing elements 122, 222 monitor (i.e., can be adapted to monitor, can be configured to monitor, etc.) changes in electrical properties (e.g., capacitance, resistance and inductance, respectively) across a sensing surface in order to detect and locate touch inputs (i.e., inputs made by direct contact or through the use of a stylus) on the sensing surface. Such electrical touch sensing elements are well-known in the art and, thus, the details are omitted from this specification in order to allow the reader to focus on the salient aspects of the embodiments described.

Figure 7:
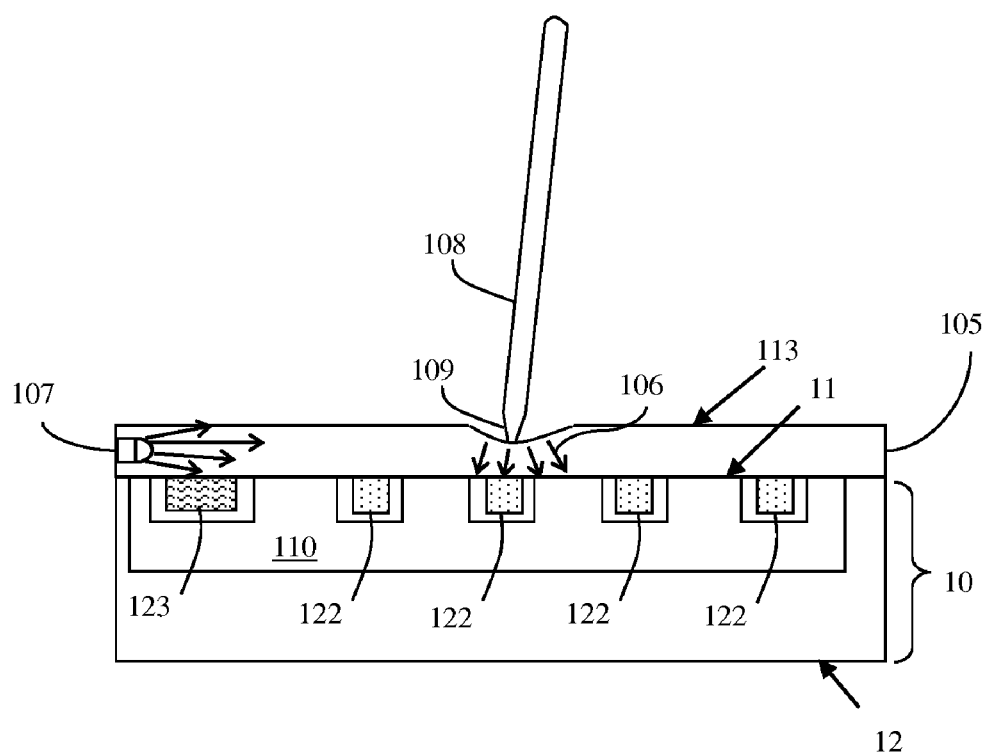
FIG. 7 is a cross-section diagram illustrating an illuminated edge for an interface device.

Alternatively, the touch sensing elements 122, 222 can comprise optical touch sensing elements that can be formed within a semiconductor substrate. As shown in FIG. 7 with respect to the interface device 100 for illustration purposes, such optical touch sensing elements 122, 222 can sense changes (i.e., can be adapted to sense changes, can be configured to sense changes, etc.) in light 106 (e.g., ambient light) reflected from the surface 113 of a flexible film 105 towards the substrate 10 in response to pressure 109 locally applied, either directly or indirectly by a stylus 108, to the flexible film 105 in order detect and locate touch input. Also as shown in FIG. 7 with respect to the interface device 100 for illustration purposes, interface device 100, 200 can further comprise an illuminated edge 107 (i.e., an edge configured with a supplemental light source) bordering the solar cell 110, 210. This illuminated edge 107 can augment (i.e., can be adapted to augment, configured to augment, etc.) ambient light reflection towards the substrate 10 in response to the locally applied pressure 109 on the flexible film 105 in order to enhance detection and location of user touch inputs. Such optical touch sensing elements are well-known in the art and, thus, the details are omitted from this specification in order to allow the reader to focus on the salient aspects of the embodiments described.

Although surrounded by portions of the solar cell 110, 210, each of the interface elements 121 or 122 (i.e., each pixel 125) in the interface device 100 or each group of interface elements 221, 222 (i.e., each pixel 225) in the interface device 200 can be electrically isolated from the solar cell 110, 210 by isolation regions 130, 230. The isolation regions 130, 230 can, for example, comprise appropriately doped well regions within the substrate 10, as illustrated. For example, in the case of a planar, P-N junction type solar cell 110, 210, p-type regions of the solar cell can contain NWELLs within which interface elements are located and n-type regions of the solar cell can contain PWELLs within which interface elements are located. However, any other suitable isolation region could be used. For example, the interface elements can be formed within trenches lined with isolation material (e.g., silicon dioxide ($SiO_2$), silicon nitride (SiN), etc.).

Optionally, the interface device 100, 200 can further comprise at least one additional device 123, 223 (e.g., an analog or digital device) also within the substrate 10 so that additional functions (e.g., processing functions) can be performed by the interface device 100, 200. For example, one or more additional devices 123, 223 can be positioned within or on the substrate 10 at the first surface and surrounded laterally by the solar cell 110, 210. Isolation regions 130, 230 can similarly electrically isolate the additional device(s) 123, 223 from the solar cell 110, 210.

Referring to FIGS. 3A-B and 4A-B, in another embodiment, the interface device 300, 400 can similarly comprise a substrate 10 (e.g., a Group IV semiconductor substrate, such as silicon or germanium) with a first surface 11 and a second surface 12 opposite the first surface 10.

The interface device 300, 400 can further comprise an array 310, 410 of solar cells 311, 411, rather than a single solar cell as in the embodiments described above and illustrated in FIGS. 1A-b and 2A-B. Specifically, the interface device 300, 400 can comprise an array 310, 410 of solar cells 310 positioned within the substrate 10 at the first surface 11. The solar cells 311, 411 can be arranged, for example, in a grid pattern (i.e., in a pattern of columns and rows). These solar cells 311, 411 can each comprise any suitable solar cell configuration. For example, each solar cell 311, 411 can comprise a defined, large-area, planar, P-N junction type solar cell within and at the first surface 11 of the substrate 10. Alternatively, each solar cell 311, 411 can comprise a thin film type solar cell, including, for example, a power conductor layer within the surface 11 of the substrate 10, a p-type silicon layer on the power conductor layer, an n-type silicon layer on the p-type silicon layer, a ground conductor grid layer on the n-type silicon layer and an anti-reflective coating layer on the conductor grid layer. Such solar cell configurations are well-known in the art and, thus, the details are omitted from this specification in order to allow the reader to focus on the salient aspects of the embodiments described.

Figure 3A:
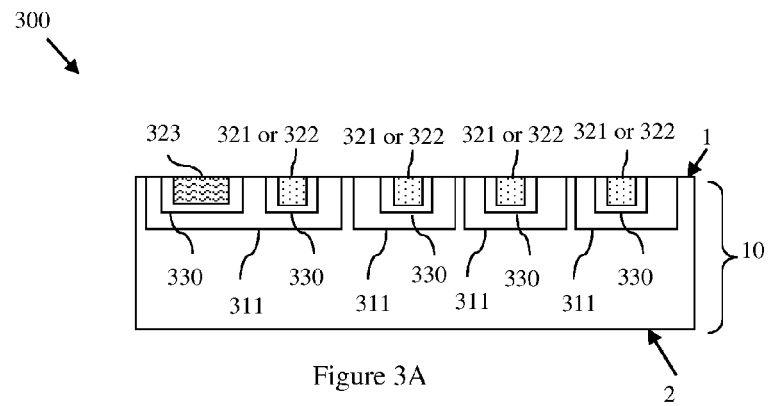
FIG. 3A is a cross-section diagram illustrating yet another embodiment of an interface device with integrated power collection functions.
Figure 3B:
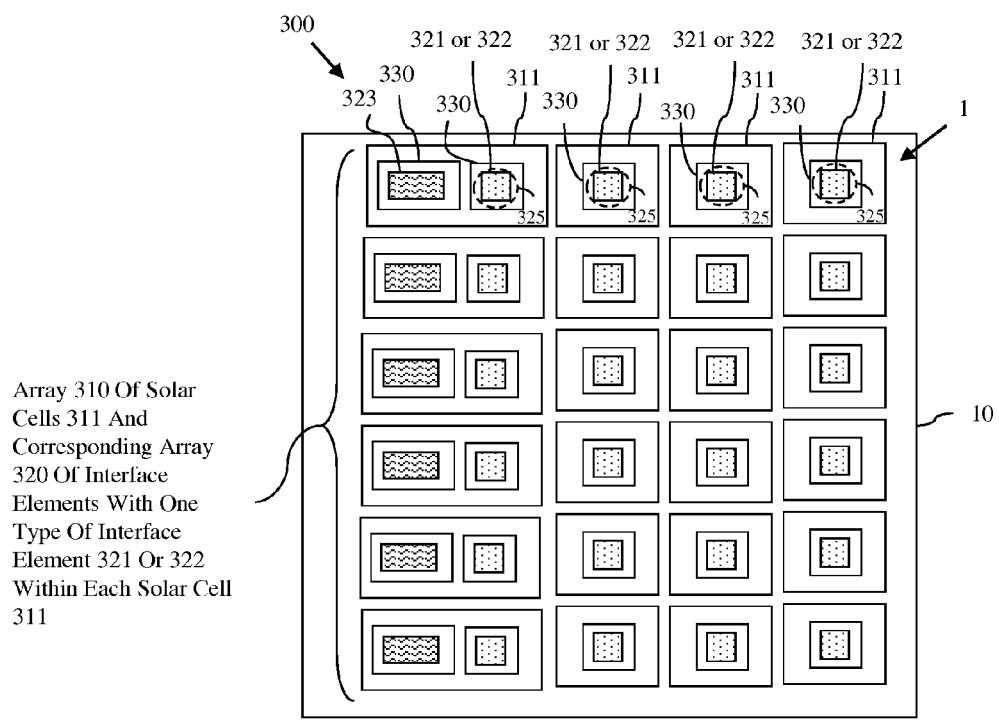
FIG. 3B is a top view diagram further illustrating the embodiment of the interface device of FIG. 3A.
Figure 4A:
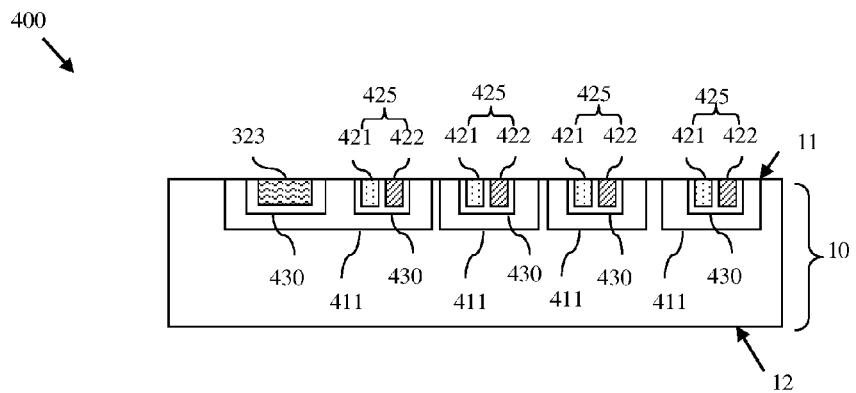
FIG. 4A is a cross-section diagram illustrating yet another embodiment of an interface device with integrated power collection functions.
Figure 4B:
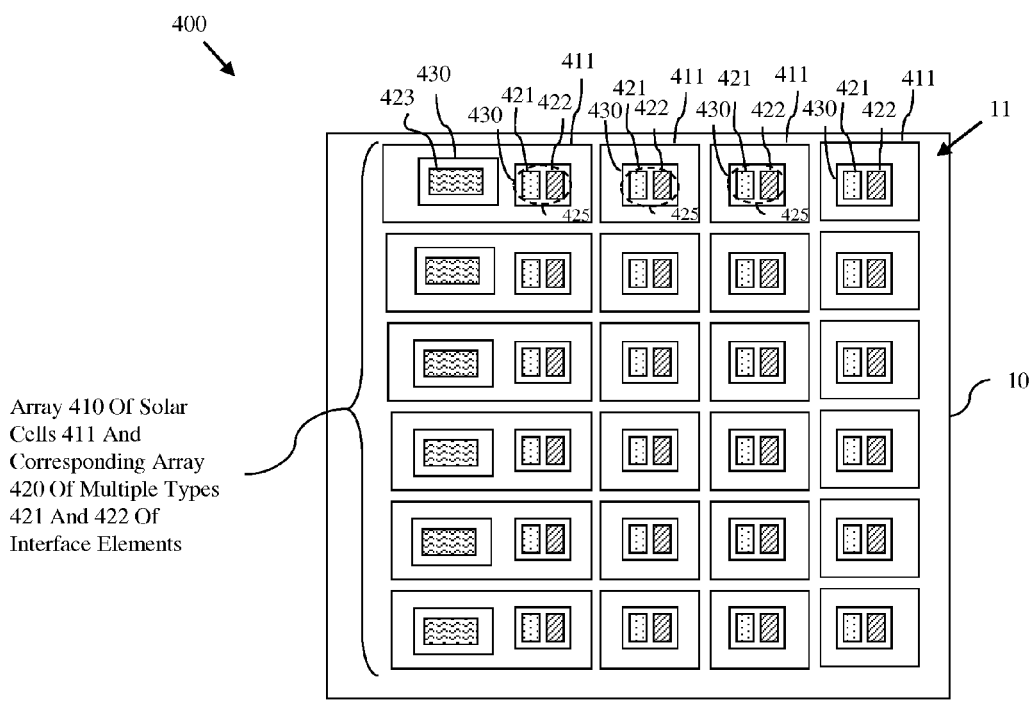
FIG. 4B is a top view diagram further illustrating the embodiment of the interface device of FIG. 4A.

The interface device 300, 400 can further comprise an array 320, 420 of interface elements within the substrate 10 also at the first surface 11. As illustrated in FIGS. 3A-B, the interface elements of interface device 300 can all be of the same type (e.g. all interface elements 321 or all interface elements 322) or can be of different types (e.g., a distributed mixture of interface elements 321 and 322) and each interface element 321 or 322 can constitute a pixel 325. The pixels 325 can, for example, be arranged in a grid pattern (i.e., a pattern of columns and rows) similar to the pattern used for the solar cell array 310 such that portions of each solar cell laterally surround a corresponding pixel 325 (i.e., a corresponding one of the interface elements 321 or 322) and are further positioned between any adjacent pixels (i.e., between any adjacent interface elements). The interface elements in the array 320 can, for example, comprise display elements 321 for a display screen that can be used by the electronic product to display information (e.g., text, images, etc.) to a user, touch sensing elements 322 for a touchpad (e.g., an electrical or optical touchpad) that can be used by the electronic product to receive input information from a user or a combination of display and touch sensing elements 321, 322 for a touchscreen display that can be used by the electronic product to both display information and receive input. Alternatively, as illustrated in FIGS. 4A-B, the interface elements of interface device 400 can be of multiple different types (e.g., interface elements 421 and 422) and a group of interface elements, including one of each of the different types 421, 422, can constitute a pixel 425. The pixels 225 can, for example, be arranged in a grid pattern (i.e., a pattern of columns and rows) similar to the grid pattern used for the solar cell array 410 such that portions of each solar cell 311 laterally surround a corresponding pixel 425 (i.e., a corresponding group of interface elements) and are further positioned between any adjacent pixels (i.e., between any adjacent groups of interface elements). The interface elements in the array 420 can comprise, for example, both display elements 421 and touch sensing elements 422 for a touchscreen display that can be used by the electronic product to display information (e.g., text, images, etc.) to a user and also receive input information from a user.

Display elements 321, 421 can comprise, for example, conventional light emitting diodes (LEDs), organic light emitting diodes (OLEDs), liquid crystal display elements (LCDs) or any other suitable display element that can be formed within a semiconductor substrate. Such display elements 321, 421 (e.g., LEDs, OLEDs, LCDs, etc.) are well-known in the art and, thus, the details are omitted from this specification in order to allow the reader to focus on the salient aspects of the embodiments described.

Touch sensing elements 322, 422 can comprise, for example, electrical touch sensing elements (e.g., capacitive touch sensing elements, resistive touch sensing elements, inductive touch sensing elements or any other touch sensing elements that can be formed within a semiconductor substrate). Electrical touch sensing elements 322, 422 monitor (i.e., can be adapted to monitor, can be configured to monitor, etc.) changes in electrical properties (e.g., capacitance, resistance and inductance, respectively) across a sensing surface in order to detect and locate touch inputs (i.e., inputs made by direct contact or through the use of a stylus) on the sensing surface. Such electrical touch sensing elements are well-known in the art and, thus, the details are omitted from this specification in order to allow the reader to focus on the salient aspects of the embodiments described.

Alternatively, the touch sensing elements 322, 422 can comprise optical touch sensing elements that can be formed within a semiconductor substrate. As shown in FIG. 7 with respect to the interface device 100 for illustration purposes, such optical touch sensing elements can sense changes (i.e., can be adapted to sense changes, can be configured to sense changes, etc.) in light 106 (e.g., ambient light) reflected from the surface 113 of a flexible film 105 towards the substrate 10 in response to pressure 109 locally applied, either directly or indirectly by a stylus 108, to the flexible film 105 in order detect and locate touch input. Also as shown in FIG. 7 with respect to the interface device 100 for illustration purposes, interface device 300, 400 can further comprise an illuminated edge 107 (i.e., an edge configured with a supplemental light source) bordering the solar cell array 310, 410. This illuminated edge 107 can augment (i.e., can be adapted to augment, configured to augment, etc.) ambient light reflection towards the substrate 10 in response to the locally applied pressure 109 on the flexible film 105 in order to enhance detection and location of user touch inputs. Such optical touch sensing elements are well-known in the art and, thus, the details are omitted from this specification in order to allow the reader to focus on the salient aspects of the embodiments described.

Although surrounded by portions of the solar cells 311, 411, each of the interface elements 321 or 322 (i.e., each pixel 325) in the interface device 300 or each group of interface elements 421, 422 (i.e., each pixel 425) in the interface device 400 can be electrically isolated from the solar cell 310, 410 by isolation regions 330, 430. The isolation regions 330, 430 can, for example, comprise appropriately doped well regions within the substrate 10, as illustrated. For example, in the case of a planar, P-N junction type solar cell 310, 410, p-type regions of the solar cell can contain NWELLs within which interface elements are located and n-type regions of the solar cell can contain PWELLs within which interface elements are located. However, any other suitable isolation region could be used. For example, the interface elements can be formed within trenches lined with isolation material (e.g., silicon dioxide ($SiO_2$), silicon nitride (SiN), etc.).

Optionally, the interface device 300, 400 can further comprise at least one additional device 323, 423 (e.g., an analog or digital device) also within the substrate 10 so that additional functions (e.g., processing functions) can be performed by the interface device 300, 400. For example, one or more additional devices 323, 423 can be positioned within the substrate 10 at the first surface and surrounded laterally by any one of the solar cells 311, 411. Isolation regions 330, 430 can similarly electrically isolate the additional device(s) 323, 423 from the solar cells 311, 411.

In each of the above-described embodiments illustrated in FIGS. 1A-B, 2A-B, 3A-B, and 4A-B, the interface device 100, 200, 300, and 400, respectively, comprises solar cell(s) and interface elements that are positioned within a substrate 10 at the same surface 11; however, in yet another embodiment, the interface elements can be within the substrate, but at the opposite surface. Specifically, referring to FIGS. 5A-C, the interface device 500 can comprise a substrate 10 (e.g., a Group IV semiconductor substrate, such as silicon or germanium) with a first surface 11 and a second surface 12 opposite the first surface 11.

The interface device 500 can comprise at least one solar cell 511 (i.e., a single solar cell or an array of solar cells 511, as shown). The solar cell(s) 511 can be positioned within the substrate 10 at the first surface 10. The solar cell(s) 511 can comprise any suitable solar cell configuration. For example, each solar cell 511 can comprise a defined, large-area, planar, P-N junction type solar cell within and at the first surface 11 of the substrate 10. Alternatively, each solar cell 511 can comprise a thin film type solar cell, including, for example, a power conductor layer within the surface 11 of the substrate 10, a p-type silicon layer on the power conductor layer, an n-type silicon layer on the p-type silicon layer, a ground conductor grid layer on the n-type silicon layer and an anti-reflective coating layer on the conductor grid layer. Such solar cell configurations are well-known in the art and, thus, the details are omitted from this specification in order to allow the reader to focus on the salient aspects of the embodiments described.

The interface device 500 can further comprise an array of interface elements 520. However, in this case the interface elements 520 can be positioned within the substrate 10 at the second surface 12 (i.e., opposite the solar cell(s) 511), rather than at the first surface 11.

The interface elements in the array 520 can, for example, comprise display elements 521 for a display screen that can be used by the electronic product to display information (e.g., text, images, etc.) to a user, touch sensing elements 522 for a touchpad (e.g., an electrical or optical touchpad) that can be used by the electronic product to receive input information from a user, or both display elements 521 and touch sensing elements 522 for a touchscreen display that can be used by the electronic product to display information (e.g., text, images, etc.) to a user and also receive input information from a user.

Display elements 521 can comprise, for example, conventional light emitting diodes (LEDs), organic light emitting diodes (OLEDs), liquid crystal display elements (LCDs) or any other suitable display element that can be formed within a semiconductor substrate. Such display elements 521 (e.g., LEDs, OLEDs, LCDs, etc.) are well-known in the art and, thus, the details are omitted from this specification in order to allow the reader to focus on the salient aspects of the embodiments described.

Touch sensing elements 522 can comprise, for example, electrical touch sensing elements (e.g., capacitive touch sensing elements, resistive touch sensing elements, inductive touch sensing elements or any other touch sensing elements that can be formed within a semiconductor substrate). Electrical touch sensing elements 522 monitor (i.e., can be adapted to monitor, can be configured to monitor, etc.) changes in electrical properties (e.g., capacitance, resistance and inductance, respectively) across a sensing surface in order to detect and locate touch inputs (i.e., inputs made by direct contact or through the use of a stylus) on the sensing surface. Such electrical touch sensing elements are well-known in the art and, thus, the details are omitted from this specification in order to allow the reader to focus on the salient aspects of the embodiments described.

Alternatively, the touch sensing elements 522 can comprise optical touch sensing elements that can be formed within a semiconductor substrate. As shown in FIG. 7 with respect to the interface device 100 for illustration purposes, such optical touch sensing elements can sense changes (i.e., can be adapted to sense changes, can be configured to sense changes, etc.) in light 106 (e.g., ambient light) reflected from the surface 113 of a flexible film 105 towards the substrate 10 in response to pressure 109 locally applied, either directly or indirectly by a stylus 108, to the flexible film 105 in order detect and locate touch input. The interface device 500 can further comprise an illuminated edge (i.e., an edge configured with a supplemental light source) bordering the array 520 of interface elements. This illuminated edge can augment (i.e., can be adapted to augment, configured to augment, etc.) ambient light reflection towards the substrate 10 in order to enhance detection and location of user touch inputs. Such optical touch sensing elements are well-known in the art and, thus, the details are omitted from this specification in order to allow the reader to focus on the salient aspects of the embodiments described.

Figure 5A:
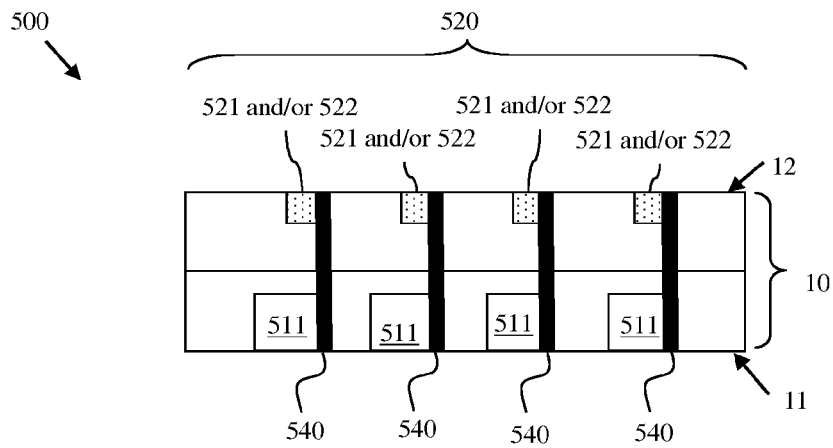
FIGS. 5A-C are cross-section diagrams illustrating another embodiment of an interface device with integrated power collection functions.
Figure 5B:
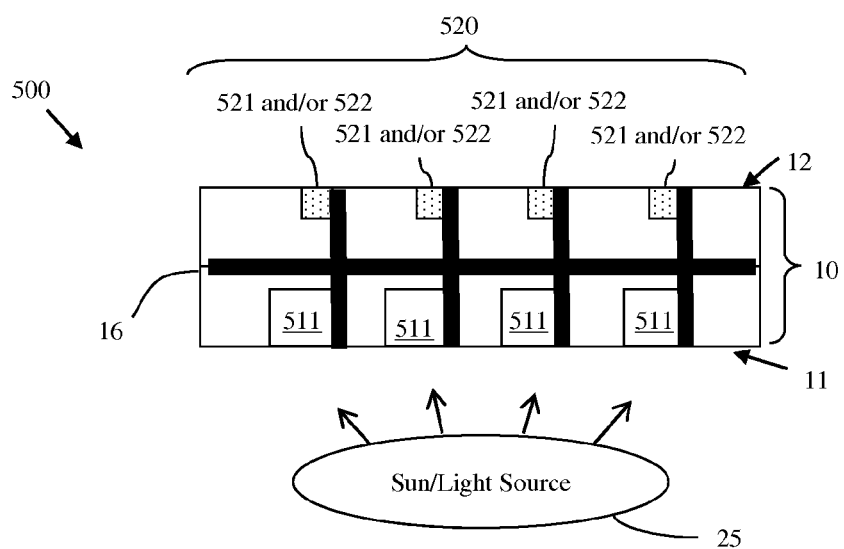
Figure 5C:
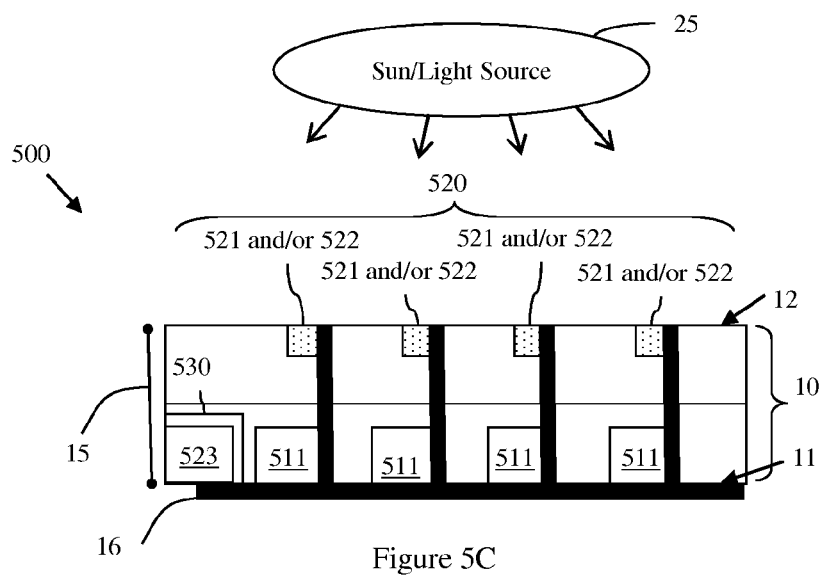

Additionally, the interface device 500 can further comprising vias 540 (i.e., conductor filled through-holes) extending vertically through the substrate 10 from the first surface 11 to the second surface 12, electrically connecting the solar cell(s) 511 to the interface elements 521, 522 and, thereby providing power for operation of the interface elements 521, 522. It should be noted that the configuration of the interface device 500 may vary depending up which surface (i.e., the first surface or the second surface) is the outer surface (i.e., the surface that is directly exposed to light 25 and visible by a user). For example, as illustrated in FIG. 5B, the first surface 11 can be designed as the outer surface so that the solar cell(s) 511 are directly exposed to light 25 for optimal solar power collection. In this case, a reflective layer 16 may, optionally, be positioned within the substrate 10 between the interface elements and the solar cell(s) 511 so as to reflect any light 25 transmitted through the solar cell(s) back towards the first surface 11 and, thereby back through the solar cell(s) in order to optimize solar power collection. Alternatively, as illustrated in FIG. 5C, the second surface 12 can be designed as the outer surface so that interface elements 521 and/or 522 and, particularly, the output of display elements 521 are visible to a user. However, since the solar cell(s) are not directly exposed to light 25, the predetermined distance 15 between the second surface 12 and the first surface 11 must be sufficiently small so as to allow transmission of light 25 through the substrate 10 passed the interface elements 521 and/or 522 towards the solar cell(s) 511 at the first surface 11 in order to achieve solar power collection. In this case, a reflective layer 25 can be positioned on the first surface 10 and, more particularly, on the solar cell(s) 511. In either case the reflective layer 25 can comprise a silver (Ag) layer, an aluminum (Al) layer or any other suitable highly reflective metal or metal alloy layer.

Optionally, like the above-described interface devices 100-400, the interface device 500 can further comprise at least one additional device 523 (e.g., an analog or digital device) also within the substrate 10 so that additional functions (e.g., processing functions) can be performed by the interface device 500 (e.g., see FIG. 5C). Each additional device 523 can be electrically isolated from the solar cell(s) 511 and interface devices 521 and/or 522 by an isolation region 530. The isolation region 530 can, for example, comprise an appropriately doped well region. However, any other suitable isolation region could be used.

In each of the above-described interface embodiments illustrated in FIGS. 1A-B, 2A-B, 3A-B, 4A-B and 5A-C, the interface device 100, 200, 300, 400 and 500, respectively, incorporates separate devices for power collection and interface functions (i.e., solar cell(s) and interface elements, respectively). In yet another embodiment, the interface device can use the same devices for both power collection and interface functions. Specifically, referring to FIG. 6A, the interface device 600 can comprise a substrate 10 (e.g., a Group IV semiconductor substrate, such as silicon or germanium) having a first surface 11 and a second surface opposite the first surface 11.

The interface device 600 can further comprise an array 650 of semiconductor devices and, particularly, diodes 651 that can function as either solar cells or interface elements (e.g., touch sensing elements). For example, an array of diodes 651 can comprise planar, P-N junction diodes within and at the first surface 11 of the substrate 10. This array 650 of diodes 651 can be arranged in a grid pattern of rows 660 of parallel connected diodes and columns 670 of series connected diodes.

Figure 6A:
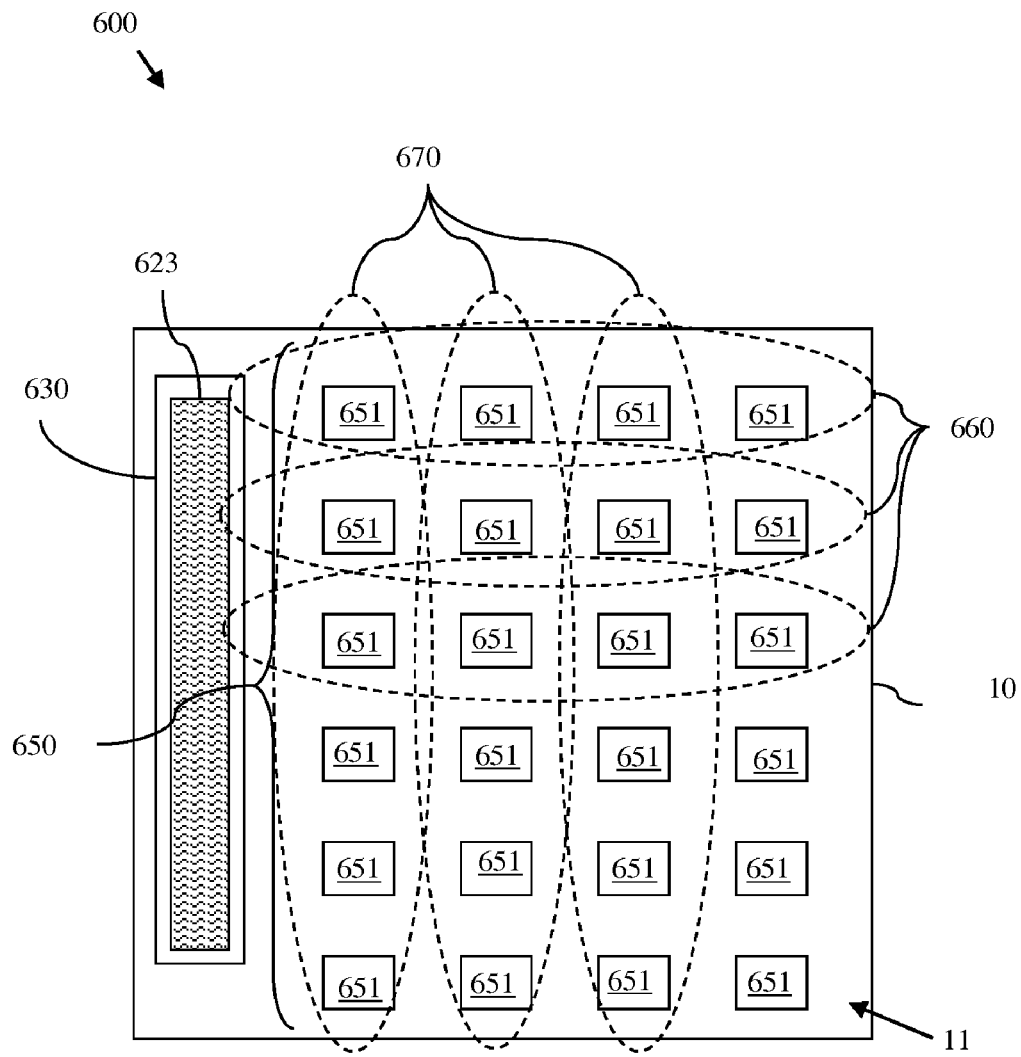
FIG. 6A is a top-view diagram illustrating yet another embodiment of an interface device with integrated power collection functions.
Figure 6B:
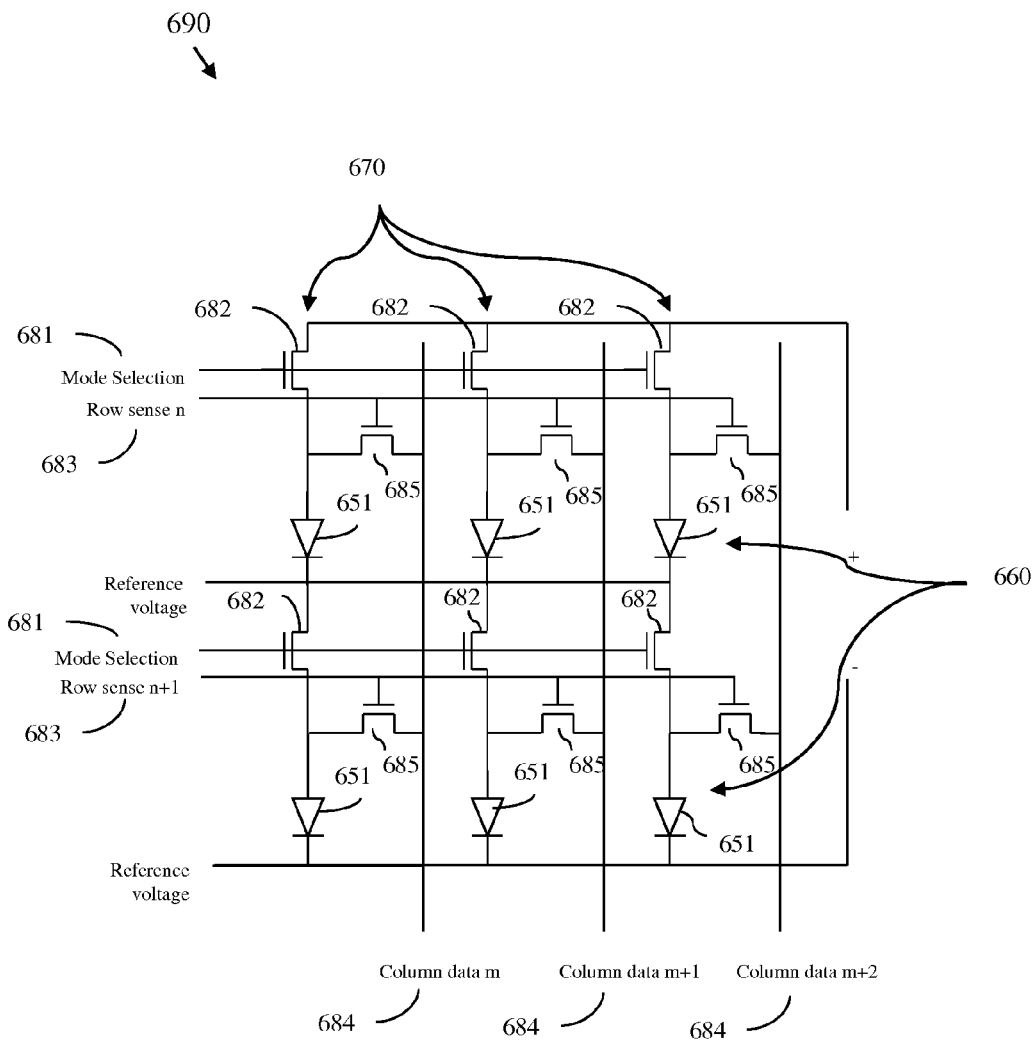
FIG. 6B a schematic diagram illustrating a wiring structure for the interface device of FIG. 6A.

Additionally, as illustrated in FIG. 6B, the interface device 600 can further comprise a wiring structure 690 connected to the diodes 651 and configured so as to allow the array 650 of diodes 651 to be selectively operated in either a power collection mode (during which all of the diodes 651 in the array 650 are electrically joined and function as solar cells) or a sensing mode (during which all of the diodes 651 in the array 650 are electrically disjoined, individually selectable and function as sensing elements). For example, the wiring structure 690 can comprise a plurality of transistors 682 connected in series with each of the diodes 651 in each of the columns 670 and also a mode selection signal wire 681 connected to all gates of all of all of these transistors 682. When high, the mode selection signal wire 681 causes the transistors 682 to electrically join all of the diodes 651 so that the diodes can function as solar cells for power collection in a power collection mode. However, when low, the mode selection signal wire 681 causes the transistors 682 to electrically disjoin the diodes 651 (i.e., to segment the diodes into pixels). The wiring structure 690 can also comprise sense wires 683 for each row 660, read wires 684 for each column 670 and additional transistors 685 configured to that, when the mode selection signal wire 681 is low and the diodes 651 are electrically disjoined, the individual diodes 651 can function as individual sensing elements (e.g., touch sensing elements) in a sense mode. That is, the sense wires 683, read wires 684 and additional transistors 685 allow a single row to be selected and a voltage on a single column to be read in order to monitor changes in voltage across a sensing surface and, thereby, to detect and locate inputs (i.e., touch inputs) on a sensing surface. With a wiring structure 690 configured in this manner, the read out of the individual diodes 651 in the sense mode can be relatively fast (e.g., 5-100 microseconds (μs) per row). Thus, for an array 650 with 100 rows, it would take only 0.5-10 ms to read the entire array 650. If array operation time is divided between power collection functions and sensing functions, the entire array 650 could feasibly be read 10 times per second in the sense mode and still operate in the power collection mode 90-99.9% of the time.

Optionally, the interface device 600 can further comprise at least one additional device 623 (e.g., an analog or digital device) also within the substrate 10 so that additional functions (e.g., processing functions) can be performed by the interface device 600 (e.g., see FIG. 6A). Each additional device 623 can be electrically isolated from the diodes 651 in the array 650 by an isolation region 630. The isolation region 630 can, for example, comprise an appropriately doped well region. However, any other suitable isolation region could be used.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an interface device (e.g., a display, touchpad, touchscreen display, etc.) with integrated power collection functions. In one embodiment, a solar cell or solar cell array can be located within a substrate at a first surface and an array of interface elements can also be located within the substrate at the first surface such that portions of the solar cell(s) laterally surround the individual interface elements or groups thereof. In another embodiment, a solar cell or solar cell array can be located within the substrate at a first surface and an array of interface elements can be located within the substrate at a second surface opposite the first surface (i.e., opposite the solar cell or solar cell array). In yet another embodiment, an array of diodes, which can function as either solar cells or sensing elements, can be within a substrate at a first surface and can be wired to allow for selective operation in either a power collection mode or sensing mode.

What is claimed is:

1. An interface device comprising:
   a semiconductor substrate having a first surface and a second surface opposite said first surface;
   a single solar cell within said semiconductor substrate at said first surface; and
   an array of interface elements within said semiconductor substrate at said first surface such that said single solar cell has portions that laterally surround and, thereby encompass, one of the following:
      each one of said interface elements individually; and
      groups of said interface elements.

2. The interface device of claim 1, said interface elements comprising at least one of display elements and touch sensing elements.

3. The interface device of claim 2, said touch sensing elements comprising optical touch sensing elements and said interface device further comprising an illuminated edge around said single solar cell.

4. The interface device of claim 2, said touch sensing elements comprising electrical touch sensing elements comprising any one of capacitive touch sensing elements, resistive touch sensing elements and inductive touch sensing elements.

5. The interface device of claim 1, said interface elements comprising multiple different types of interface elements and each group comprising at least one of each of said multiple different types of interface elements, said multiple different types of interface elements comprising at least display elements and touch sensing elements.

6. The interface device of claim 1, further comprising isolation regions electrically isolating said interface elements from said single solar cell.

7. The interface device of claim 1, further comprising at least one additional device within said semiconductor substrate at said first surface and laterally surrounded by said single solar cell.

8. An interface device comprising:
   a semiconductor substrate having a first surface and a second surface opposite said first surface;
   an array of solar cells within said semiconductor substrate at said first surface; and
   a corresponding array of interface elements within said semiconductor substrate at said first surface such that each solar cell has portions that laterally surround and, thereby encompass, one of the following:
      a corresponding one of said interface elements; and
      a corresponding group of said interface elements.

9. The interface device of claim 8, said interface elements comprising at least one of display elements and touch sensing elements.

10. The interface device of claim 9, said touch sensing elements comprising optical touch sensing elements and said interface device further comprising an illuminated edge around said solar cell.

11. The interface device of claim 9, said touch sensing elements comprising electrical touch sensing elements comprising any one of capacitive touch sensing elements, resistive touch sensing elements and inductive touch sensing elements.

12. The interface device of claim 8, said interface elements comprising multiple different types of interface elements and said corresponding group comprising at least one of each of said multiple different types of interface elements, said multiple different types of interface elements comprising at least display elements and touch sensing elements.

13. The interface device of claim 8, further comprising isolation regions electrically isolating said interface elements from said solar cells.

14. The interface device of claim 8, further comprising at least one additional device within said substrate at said first surface and laterally surrounded by one of said solar cell.

15. An interface device comprising:
   a substrate having a first surface and a second surface opposite said first surface;
   at least one solar cell within said substrate at said first surface;
   an array of interface elements within said substrate at said second surface opposite said at least one solar cell; and
   vias extending vertically through said substrate from said first surface to said second surface and electrically connecting said at least one solar cell to said interface elements.

16. The interface device of claim 15, said interface elements comprising at least one of display elements and interface elements.

17. The interface device of claim 15, said first surface comprising an outer surface of said substrate exposed to light.

18. The interface device of claim 15, said second surface comprising an outer surface of said substrate exposed to light, wherein a predetermined distance between said second surface and said first surface is sufficiently small so as to allow transmission of said light through said substrate towards said at least one solar cell at said first surface.

19. The interface device of claim 18, further comprising a reflective layer on said least one solar cell.

20. The interface device of claim 15, further comprising at least one additional device within said substrate.

* * * * *